(12) United States Patent
Liimatainen et al.

(10) Patent No.: US 10,573,868 B2
(45) Date of Patent: Feb. 25, 2020

(54) METHOD FOR COATING SEPARATOR FILMS OF LITHIUM BATTERIES AND A COATED SEPARATOR FILM

(71) Applicant: Pulsedeon Oy, Tampere (FI)

(72) Inventors: Jari Liimatainen, Oulu (FI); Ville Kekkonen, Jyväskylä (FI); Aleksey Zolotukhin, Oulu (FI)

(73) Assignee: Pulsedeon Oy, Tampere (FI)

( * ) Notice: Subject to any disclaimer, the term of this patent is extended or adjusted under 35 U.S.C. 154(b) by 0 days.

(21) Appl. No.: 15/513,801

(22) PCT Filed: Sep. 23, 2015

(86) PCT No.: PCT/FI2015/050636
§ 371 (c)(1),
(2) Date: Mar. 23, 2017

(87) PCT Pub. No.: WO2016/046452
PCT Pub. Date: Mar. 31, 2016

(65) Prior Publication Data
US 2018/0233729 A1 Aug. 16, 2018

(30) Foreign Application Priority Data
Sep. 24, 2014 (FI) ........................ 20145837

(51) Int. Cl.
*H01M 2/16* (2006.01)
*H01M 2/14* (2006.01)
(Continued)

(52) U.S. Cl.
CPC ......... *H01M 2/1686* (2013.01); *C23C 14/081* (2013.01); *C23C 14/10* (2013.01);
(Continued)

(58) Field of Classification Search
CPC .............................. H01M 2/1686; H01M 2/14
See application file for complete search history.

(56) References Cited

U.S. PATENT DOCUMENTS 5,622,567 A 4/1997 Kojima et al.
6,312,768 B1 11/2001 Rode et al.
(Continued)

FOREIGN PATENT DOCUMENTS

CN 101437644 A 5/2009
CN 103137929 A 6/2013
(Continued)

OTHER PUBLICATIONS

Proll et al. (Journal of Power Sources 255 (2014) 116-124).*
(Continued)

*Primary Examiner* — Olatunji A Godo
(74) *Attorney, Agent, or Firm* — Berggren LLP

(57) ABSTRACT

The present invention describes a method for coating porous separator films of lithium batteries and a coated separator film produced as a result of the respective manufacturing method. Laser ablation is used in the method for detaching particles from the target, and the particle flux vaporised by laser pulses is directed to the base material to be coated, to which the material is attached. The so-called roll-to-roll principle can be used in the method, in which the base material to be coated is directed from one roll to a second roll, and the coating occurs in the area between these rolls. In addition, rotating mirrors and a telecentric lens can be used for aligning the laser pulses as a rectilinear pulse front before guiding onto the target material.

18 Claims, 2 Drawing Sheets

(51) Int. Cl.
*H01M 10/052* (2010.01)
*C23C 14/08* (2006.01)
*C23C 14/10* (2006.01)
*C23C 14/28* (2006.01)
*C23C 14/56* (2006.01)
*C23C 14/24* (2006.01)
*H01M 10/058* (2010.01)

(52) U.S. Cl.
CPC .............. *C23C 14/24* (2013.01); *C23C 14/28* (2013.01); *C23C 14/56* (2013.01); *C23C 14/562* (2013.01); *H01M 2/145* (2013.01); *H01M 2/1646* (2013.01); *H01M 2/1666* (2013.01); *H01M 10/052* (2013.01); *H01M 10/058* (2013.01)

(56) References Cited

U.S. PATENT DOCUMENTS

| | | | |
|---|---|---|---|
| 6,423,411 B2* | 7/2002 | Balkus, Jr. | C23C 14/223 422/83 |
| 2004/0106037 A1* | 6/2004 | Cho | H01M 2/145 429/144 |
| 2008/0318124 A1 | 12/2008 | Hiriuchi et al. | |
| 2012/0040233 A1 | 2/2012 | Kim et al. | |
| 2012/0154982 A1* | 6/2012 | Ota | H01G 9/012 361/502 |
| 2014/0193716 A1* | 7/2014 | L'Abee | H01M 2/162 429/247 |
| 2014/0217992 A1 | 8/2014 | Li et al. | |
| 2014/0272595 A1 | 9/2014 | Cristadoro et al. | |

FOREIGN PATENT DOCUMENTS

| | | |
|---|---|---|
| CN | 103270637 A | 8/2013 |
| JP | 2000307215 A | 11/2000 |
| JP | 2011011203 A | 1/2011 |
| WO | 2007096461 A2 | 8/2007 |
| WO | 2007096486 A1 | 8/2007 |
| WO | 2013133025 A1 | 9/2013 |

OTHER PUBLICATIONS

Finnish Paten and Registration Office.
Christen, HM et al., "Recent advances in pulsed-laser deposition of complex oxides", Journal of Physics: Condensed Matter, vol. 20(2008), 264005, ISSN 0953-8984.

* cited by examiner

METHOD FOR COATING SEPARATOR FILMS OF LITHIUM BATTERIES AND A COATED SEPARATOR FILM

PRIORITY

This application is a U.S national application of the international application number PCT/FI2015/050636 filed on Sep. 23, 2015 and claiming priority of Finnish national application FI20145837 filed on Sep. 24, 2014, the contents of all of which are incorporated herein by reference.

FIELD OF THE INVENTION

The invention relates especially to lithium batteries, and to a separator film belonging to their structure. The invention further relates to the coating of the said separator films by using a so-called laser ablation method.

BACKGROUND OF THE INVENTION

As the need for mobile devices, electric cars and storage of energy has grown, there is an increased need for the development of battery technology. Lithium batteries have done well in very many applications, especially due to good energy density and recharging possibilities, compared e.g. to traditional Ni—Cd and Ni—Mn batteries.

The lithium battery technology is based on a positive cathode, in which the active material is, for example, transition metal oxide, and on a carbon-based negative anode. Microporous polymer separator is used between the anode and cathode to prevent the contact of the anode and cathode, but nevertheless allowing the movement of ions through the separator film. In addition to ion permeability, the separator film also has to have good mechanical strength and long-term resistance against heat and chemicals.

A problem with the use of polymer-based microporous films is their temperature resistance, which may be limited to below 150°, in which case a high temperature can cause a short circuit and the electrolyte to flare up and generate a fire in problem situations. Safety is important in all operating conditions, including abnormal conditions, such as crashes. It is also in this case important to try to keep the reliability of the operation of batteries as good as possible. In addition the shrinking of polymeric films during the use e.g. as the temperature rises, chemical stability and the ability of the films to bind liquid electrolyte may restrict the use of polymer membranes. It has been tried to improve the characteristics of polymer films with many different methods, examples of which are disclosed next.

The characteristics of a separator film can be boosted by coating the surface of the electrode with a combination of polymer and inorganic material, i.e. micro composite material. The manufacture is carried out by mixing an inorganic filler with polymer and solvent, by coating an electrode with this solution and by letting the solvent to exit so that a microporous mixture of polymer and inorganic material is obtained. Because the separator is not entirely made of inorganic material, its insulating capacity does not necessarily correspond to a uniform layer of inorganic material.

Also fully inorganic ceramic separator films reinforced with small amounts of binding agent have been used in lithium batteries. Their advantage is that, among other things, they have a very good thermal and chemical stability and the ability to bind liquid electrolyte. On the other hand, their use is restricted by their poor treatability, for example, in rolling and installations.

In order to enhance the reliability of separator films, their stability has been improved, for example, by coating one or both sides of the separator film with a ceramic coating in order to obtain strength, insulating size, and temperature resistance. Manufacturing ceramic coatings e.g. with different wet processes does not necessarily provide the lithium batteries with the required homogeneity. The control of pore size distribution is difficult and, for example, the production of very fine-grained pore networks may be impossible. The adherence in the polymer separator films is also not necessarily sufficient. The thickness of this type of film is often several micrometres, which in its part impedes the permeability of ions and reduces the relative amount of active material and the ability of the lithium batteries to store energy.

SUMMARY OF THE INVENTION

The present invention discloses a method for coating the porous polymer film used in Li batteries with a porous coating. The method comprises the following steps. First short-term laser pulses are applied to the target. As a consequence, inorganic material comes off from the target e.g. as atoms and particles by laser ablation. After this in the method detached inorganic material is directed to at least one surface or part of the surface, as a consequence of which a porous coating is produced to at least one surface of the polymer surface or part of the surface as the inorganic material attaches to the said surface of the polymer film.

In an embodiment of the method of the present invention the thickness of the thin film produced onto the surface of the polymer film is at least 50 nm.

In an embodiment of the method of the present invention the thickness of the thin film produced onto the surface of the polymer film is at most 4000 nm.

In an embodiment of the method of the invention the inorganic material used in the coating is oxide, nitride or boride.

In an embodiment of the method of the invention the material coming off from the target and the material transferring from the target onto the polymer film is achieved by laser pulses directed to the target so that the temporal duration of an individual laser pulse is between 0.5-1000 ps.

In an embodiment of the method of the invention laser pulses are produced on a repetition frequency, which is between 100 kHz-100 MHz.

In an embodiment of the method of the invention the material for the polymer film is polyethylene or polypropylene.

In an embodiment of the method of the invention the porosity of the polymer film is between 20-70 volumetric percentages.

In an embodiment of the method of the invention the porosity of the inorganic coating is between 20-70 volumetric percentages.

In an embodiment of the method of the invention the porosity of the inorganic coating is between 30-55 volumetric percentages.

In an embodiment of the method of the invention the polymer film moves from a first roll to a second roll and the material flux to be detached from the target is simultaneously directed to at least one surface or part of the surface of the polymer film with the help of laser pulses and a coating comprising inorganic material is thus formed.

In an embodiment of the method of the invention laser pulses are directed to rotating mirrors, in which there is formed a fan-shaped distribution of laser beams, which is guided to a telecentric lens used for essentially forming a front of concurrent laser pulses, which is further directed to the target for detaching the material.

In an embodiment of the method of the invention the laser ablation and coating occur in a vacuum chamber, vacuum or background gas, and at a controlled pressure of $10^{-8}$-1000 mbar.

In an embodiment of the method of the invention the inorganic material is aluminium oxide, silicon oxide, or it consists of several different ceramic materials.

In an embodiment of the method of the invention the inorganic coated material layer consists of two or several material layers, which are made by using at least two different target materials.

In an embodiment of the method of the invention in the coating there is first made a tight inorganic coating on a porous polymer film so that, the thickness of the coating is at most 100 nm, after which a further coating is conducted either on the coating already made or on the opposite surface of the porous polymer film so that the porosity of the further coating is bigger than 30%.

In an embodiment of the method of the invention in the coating there is first made an inorganic coating with a porosity of less than 30% on the porous polymer film so that the thickness of the coating is at most 100 nm, after which a further coating is conducted either on the coating already made or on the opposite surface of the porous polymer film so that the porosity of the further coating is bigger than 30%.

In an embodiment of the method of the invention the porosity of the coating to be produced is selected to be 0% so that the coating becomes tight; and in which the thickness of the produced coating is at most 100 nm.

The inventive idea of the invention also comprises the final product manufactured with the method, i.e. a separator film to Li batteries. The characteristic features of the separator film are that it comprises a porous polymer film and a porous coating, which is made of inorganic material, and in which the attachment of the porous coating onto the surface of the porous polymer film has been carried out by means of laser ablation.

SHORT DESCRIPTION OF THE DRAWINGS

DETAILED DESCRIPTION OF THE INVENTION

In the method of the invention a composite separator film is prepared, in which a porous coating of an inorganic material, such as metal oxide or a compound of several oxides is prepared on the one or both surfaces or part of the surface of a microporous polymer film (i.e. polymer membrane). The coating can thus be either an appropriately chosen oxide or alternatively it can also be a desired nitride or boride. The coating is prepared by making the target material to come off by laser ablation using temporally very short laser pulses directed to the target material, forming in this way particles and the generating material is directed to the surface of the polymeric base material. The ablation is not necessarily a complete atomization of the material, but the material coming off from the target material may also contain so-called droplets, material broken off from the target material and partly particles or particle groups generated in the plasma after ablation. The manner how the material detaches from the target material can be used for controlling the generated microstructure and pore distribution of the coating and the thermal stress developing in the polymeric base material.

Figure 1:
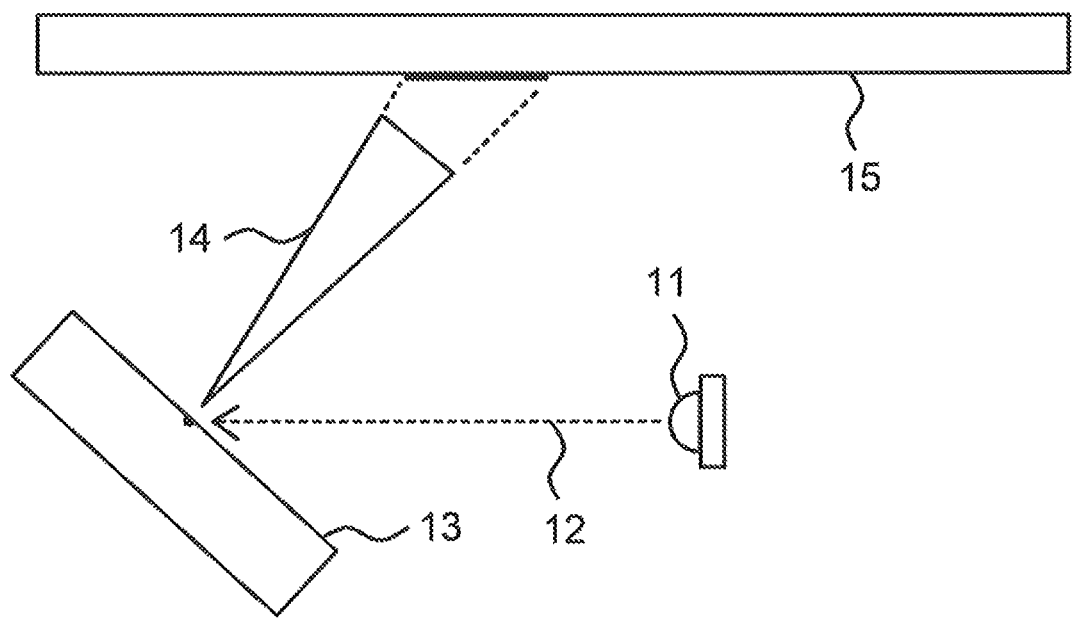
FIG. 1 illustrates the principle of the coating procedure with different physical components in an example of the invention.

This basic principle is illustrated in the principle figure of FIG. 1, in which the structural parts involved in the coating procedure and the directions of motion of the material are shown at a principled level. In FIG. 1 the laser light source 11 functions as the energy source for the ablation process, laser light being applied as short pulses 12 towards the target material 13. The laser pulses 12 cause in the surface of the target material 13 local detachment of the material from the target as particles or other respective parts mentioned above. This way particle material flow 14 is generated, which is directed towards the material 15 to be coated. The correct orientation can be realised by positioning the direction of the plane of the target material surface 13 in an appropriately bevelled manner in relation to the direction of the arriving laser pulses 12 so that the direction of the motion energy releasing in the form of plasma is towards the material 15 to be coated. The laser source 11 can naturally be transferred in relation to the target 13, or the angle of direction of the laser beams in relation to the surface of the target 13 can be varied. In addition a separate arrangement can be placed between the laser source 11 and the target 13, with which the front of laser pulses hitting the target can be made rectilinear. There is a separate FIG. 4 of this arrangement.

Figure 3:
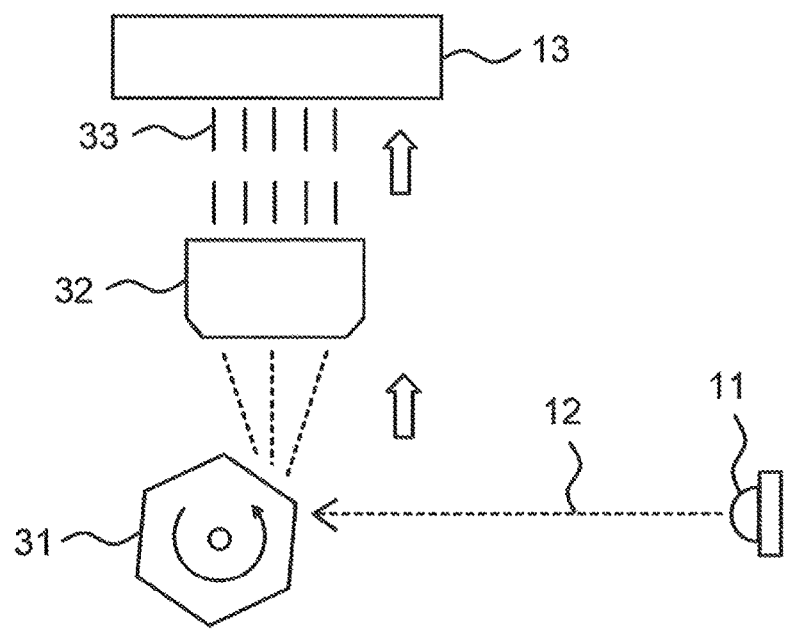
FIG. 3 illustrates an example of a so-called roll-to-roll principle relating to the coating process.

The plasma and particle material flow 14 in FIG. 1 can be fan-shaped so that a wider area can be coated on the area of the surface 15 to be coated by using one angle of direction of the laser pulses; assuming that the material to be coated is not moved in lateral direction (seen from the Figure). In a second embodiment the material to be coated can be moved, and a separate FIG. 3 illustrates this embodiment.

Generally taken in an example of ablation used in the invention the detachment of the material of the target surface and the formation of particles and the transfer of material from the target to the polymer film is achieved by laser pulses applied to the target, in which the temporal duration of an individual laser pulse may be between 0.5-1000 ps.

In an example of the invention laser pulses can be produced on a repetition frequency, which is between 100 kHz-100 MHz.

The material for the used polymer film can be, for example, polyethylene or polypropylene.

Thermal stress caused by the material detached by laser ablation must not cause melting or damaging of the polymer film or closing of micropores. Thermal stress is controlled by adjusting the ablation occurring by means of laser pulses and other detachment of material so that the thermal stress coming to the polymer film through the kinetic energy transferring from the target material and partly through thermal energy does not exceed the thermal stress of the permitted maximum temperature. Compared with known thin film coating methods, and compared with PVD (Physical Vapor Deposition) and CVD (Chemical Vapor Deposition) methods, the increase in temperature is slighter when using laser ablation.

The film formed by the material transferring from the target material to the base material by laser ablation and as particles has to build a reliable bond with the polymer film. This can be achieved by sufficient kinetic energy of the particles, which makes possible sufficient energy to form an attachment between the inorganic coating and polymer film.

Figure 2:
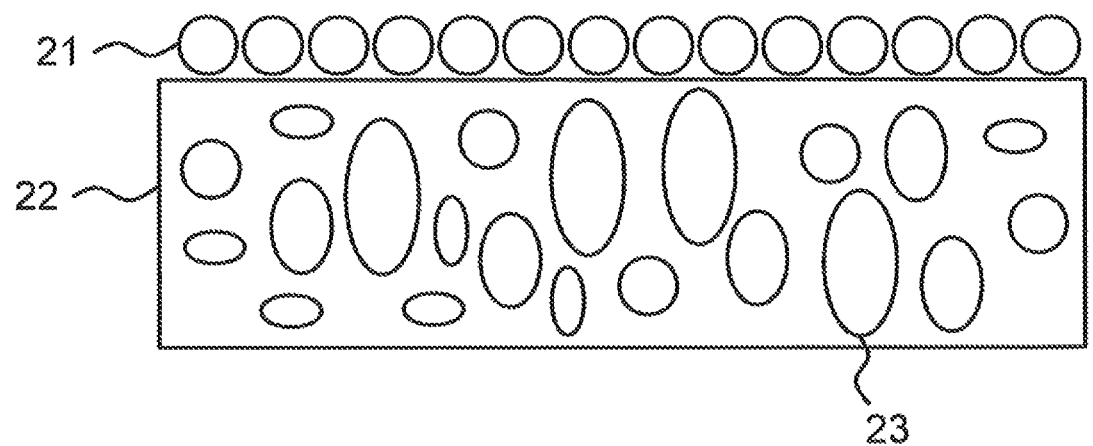
FIG. 2 illustrates an exemplary structure of a coated separator film.

The porosity of the forming coating has to be sufficient to make possible the diffusion of ions through the coating and film. In FIG. 2 there is shown an exemplary structural view of a separator film for lithium batteries functioning as an embodiment of the invention after it has been coated using the method of the invention. The separator film 22 typically used in battery applications is polymer-based and it has a microporous 23 structure, as has been stated above. The pores 23 of the polymer film can be of variable sizes. Also the coating 21 formed of inorganic material is of a porous structure. In separator films for lithium batteries the porosity of microporous polymer films is typically between 30-50 volumetric percentages and the objective is that the porosity of the inorganic coating would be at least 30 volumetric percentages. It is essential that the porosity of the inorganic material is principally thorough and this makes possible that an electrolyte moistens the film as well as possible. The porous material is obtained by detaching material by laser ablation and by creating circumstances, in which nanoparticles typically of 10-100 nm or particle groups formed by these are established as detached material. As these particles and particle groups accumulate on the surface of the polymer film, they form a porous coating. Alternatively, detachment of material carried out by laser ablation occurs entirely or partly through molten particles or particles coming off from the target material, which form a coating of inorganic material on the surface of the polymer film. The previous mechanism produces a finer particle distribution so that also the pore distribution becomes finer. In practice, the coating is often generated with both mechanisms, which is additionally complemented by the plasma generated as the result of laser ablation. By controlling the different separation mechanisms of the material it is possible to adjust the structure and porosity of the inorganic coating.

In an example of the invention the thickness of the thin film to be produced on the surface of a polymer film is at least 50 nm. In another example the thickness of the thin film to be produced on the surface of the polymer film is at most 4000 nm. The inorganic material for the coating or thin film can be aluminium oxide, silicon oxide, or it consists of several different ceramic materials.

As a parameter option in an embodiment of the invention the porosity of the polymer film can be between 20-70 volumetric percentages. In one embodiment the porosity of the inorganic coating can be between 20-70 volumetric percentages, and in a second embodiment 30-55 volumetric percentages can be selected as the parameter interval for the porosity in question. In addition to the material flow coming directly from the target material it is also possible to make use of a technology, in which the material coming off from the target material reacts with the gaseous material in the coating chamber, forming a coating on the surface of the base material.

Besides the kinetic energy of the material coming off from the target material and the particles, with the properties of the gas used in the coating chamber it is also possible to control the formation of particles from the material that has already come off. In other words, the properties of the gas form one central process parameter.

In one embodiment the laser ablation and the coating occur in a vacuum chamber, vacuum or background gas, to which a controlled pressure can be applied. One option is to set the pressure between $10^{-8}$-1000 mbar.

For improving uniform quality and productivity it would be advantageous to produce as wide a material flow as possible from the target to the base material. In one example of the invention this can be carried out by disintegrating the laser pulses by rotating mirrors into a laser pulse front in the same plane. This arrangement is illustrated in FIG. 3. Instead of the target, the laser pulses 12 of the laser source 11 are thus directed to the rotating mirrors 31. This type of a mirror structure can be, for example, a hexagonal and rotatable mirror surface. The laser pulses 12 are reflected from the rotating mirrors 31 into a fan-shaped laser pulse formation (or laser beam distribution), and the said reflected pulses are guided to a telecentric lens 32. By means of the telecentric lens 32, the laser pulse front can be aligned essentially as a rectilinear laser pulse front 33 so that the laser pulses hit the target material 13 in the same angle. In the example of this figure the said angle is 90°.

Figure 4:
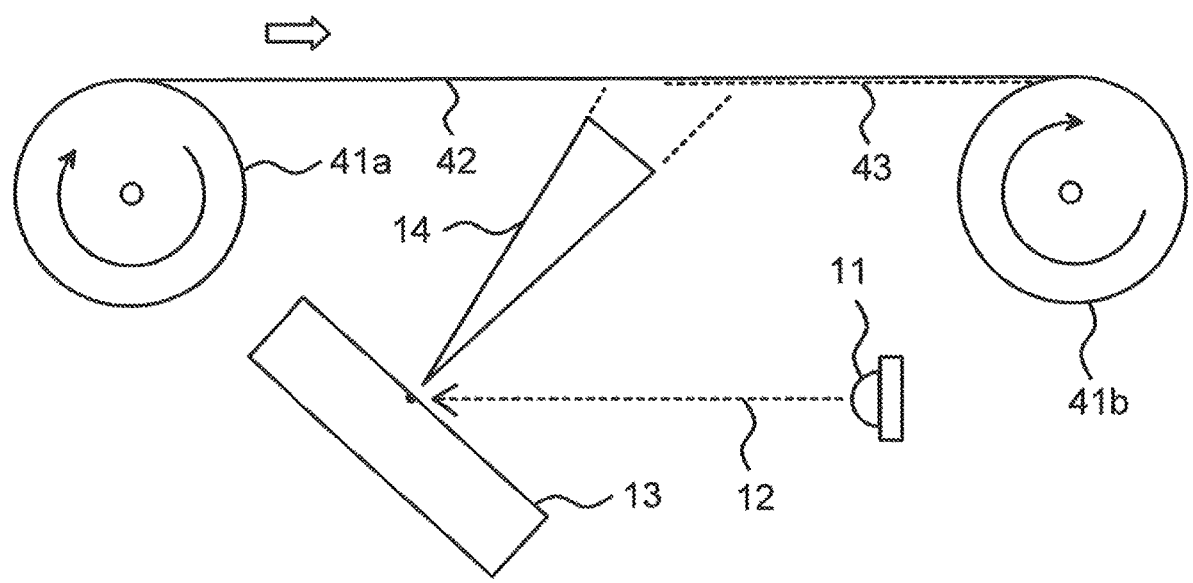
FIG. 4 illustrates the principle of forming a fan-shaped rectilinear laser pulse front with an apparatus arrangement of the invention.

In one application example the separator film is well suited for coating so that material is reeled off from a roll to be coated to the desired width in the coating chamber. A principle figure of this application option is illustrated in FIG. 4. Material is targeted to the desired coating width from one or several coating sources so that material is continuously reeled off from the roll for coating, and after the material has passed the coating zone, it is reassembled to the roll. This method can be called a roll-to-roll principle. In other words, the separator film 42 to be coated is originally found around the roll 41a. The ablation apparatus with laser sources 11 and target material 13 is included as has been described above. The laser pulses 12 make the material to come off as the particle flow 14 (in other words in the form of a material flux) towards the material 42 to be coated, and as a result of adhesion the coated polymer film 43 is produced. The coated polymer film 43 is allowed to rotate around the second roll 41b, the direction of motion of the film being from left to right in the situation in FIG. 4. The roll structures 41a, 41b can be controlled by motors. The separator film to be coated can be the whole area of the surface or only part of the surface seen from the direction of depth in the Figure. Likewise in the direction of motion of the film a desired part (length) of the film can be selected to be coated, or alternatively, the whole roll can be processed from the beginning to the end so that the entire roll becomes coated.

In the invention it is also possible to use several different targets with different materials or alternatively one target, which consists of several ablatable materials. An inorganic coated material layer can thus consist of two or several material layers, which are prepared by using at least two different target materials.

In one embodiment of the invention the coating can be made in at least two stages so that in the coating process a tight inorganic coating is first made on a porous polymer film so that the thickness of this coating is at most 100 nm. After this a further coating is applied either on the prepared coating or on the opposite surface of the porous polymer film so that the porosity of the further coating is bigger than 30%. The percentage share of the porosity of the coating layer refers to the share of empty volume (openings) from the whole volume defined by the edge surfaces of the coating. Alternatively the porous coating can be made first and after this the said thin tight coating either on the porous coating or on the opposite side of the polymer film.

In an embodiment of the invention an inorganic coating with a porosity of less than 30% is first applied on the porous polymer film so that the thickness of the coating is at most 100 nm. After this a further coating is applied either on the prepared coating or on the opposite surface of the porous polymer film so that the porosity of the further coating is bigger than 30%. Alternatively the more porous coating can be prepared first and after this the said less porous coating can be applied on the more porous coating or on the opposite side of the polymer film.

According to an embodiment of the invention, the porosity of the coating is chosen as 0% in the method so that the coating becomes tight, and further in the method the thickness of the coating produced is at most 100 nm.

Porosity can thus be varied between different stages of the coating, and when needed, the porosity parameter can be selected as zero so that the layer in question is practically non-porous, i.e. a fully tight material layer.

As has previously come out in many connections, the inventive idea of the invention also includes the manufactured product, i.e. separator film in addition to the manufacturing method. The separator film comprises a porous polymer film, a porous coating of inorganic material, and in the separator film the attachment of the porous coating on the surface of the porous polymer film has been carried out by means of laser ablation.

The method of the present invention has the following advantages:
i. An inorganic material coating can be prepared on the surface of a polymer film without damaging the porous polymer film.
ii. A good adhesion is achieved between the inorganic coating and the polymer film.
iii. A uniform coating is achieved in relation to thickness and porosity.
iv. The good quality of the coating makes possible the manufacture of a thinner inorganic coating, which increases the energy density of the battery and makes it easier for the ions to penetrate the separator film.
v. The amount and distribution of porosity can be tailored by adjusting the process parameters.
vi. Good productivity is achieved by making use of the so-called roll-to-roll principle and efficient lasers.

In the invention it is possible to combine individual features of the invention mentioned above and in the dependent claims to form new combinations, in which it is possible to include two or several individual features in the same embodiment.

The present invention is not restricted solely to the examples shown, but many variations are possible within the scope defined by the claims.

The invention claimed is:

1. A method for coating a porous polymer film used in Li batteries with a porous coating, the method comprising following steps:
   laser pulses of a short duration are applied to a target;
   inorganic material is detached from the target by laser ablation;
   the detached inorganic material is directed to at least one surface or part of the surface of the polymer film; and
   the porous coating is produced on the at least one surface or part of the surface of the polymer film by the inorganic material attaching to said surface of the polymer film, wherein
   the porous coating leaves micropores of the polymer film open,
   porosity of the porous coating is principally thorough, and
   the porosity of the porous coating allows diffusion of ions through the porous coating and the polymer film.

2. The method according to claim 1, wherein the porous coating produced on the surface of the polymer film is a thin film and its thickness is at least 50 nm.

3. The method according to claim 1 wherein the porous coating produced on the surface of the polymer film is a thin film and its thickness is at most 4000 nm.

4. The method according to claim 1, wherein the inorganic material is oxide, nitride or boride.

5. The method according to claim 1, wherein ablation of inorganic material from the target and direction of the detached material to at least one surface or part of the surface of the polymer film is achieved by the laser pulses applied to the target, temporal duration of an individual laser pulse being between 0.5-1000 ps.

6. The method according to claim 1, wherein the laser pulses are generated on a repetition frequency, which is between 100 kHz-100 MHz.

7. The method according to claim 1, wherein the material of the polymer film is polyethylene or polypropylene.

8. The method according to claim 1, wherein the porosity of the polymer film is between 20-70 volumetric percentages.

9. The method according to claim 1, wherein the porosity of the inorganic porous coating is between 20-70 volumetric percentages.

10. The method according to claim 1, wherein the porosity of the inorganic porous coating is between 30-55 volumetric percentages.

11. The method according to claim 1, wherein in the method the polymer film moves from a first roll to a second roll, and material flux formed of the detached inorganic material from the target is simultaneously guided to at least one surface or part of the surface of the polymer film by means of laser pulses, thus forming the porous coating comprising inorganic material.

12. The method according to claim 1, wherein the laser pulses are guided to rotating mirrors, in which a fan-shaped laser beam distribution is formed, which is directed to a telecentric lens, the lens being used to form an essentially rectilinear front of laser pulses, which is further directed to the target to detach the material.

13. The method according to claim 1, wherein the laser ablation and the coating occur in a vacuum chamber, vacuum or background gas and in a controlled pressure of $10^{-8}$-1000 mbar.

14. The method according to claim 1, wherein the inorganic material is aluminium oxide, silicon oxide or it consists of several different ceramic materials.

15. The method according to claim 1, wherein the porous coating consists of two or several material layers, which are prepared by using at least two different target materials.

16. The method according to claim 1, wherein a tight inorganic coating is first prepared on the porous polymer film, the coating having a thickness of at most 100 nm, after which a further coating is conducted either on the tight inorganic first prepared coating or on an opposite side of the porous polymer film so that porosity of the further coating is bigger than 30%.

17. The method according to claim 1, wherein an inorganic coating with a porosity of less than 30% is first prepared on the porous polymer, the coating having a thickness of at most 100 nm, after which a further coating is conducted either on the first prepared coating with a porosity of less than 30% or on an opposite side of the porous polymer film so that porosity of the further coating is bigger than 30%.

18. A separator film for Li batteries comprising
a porous polymer film, and
a porous coating of inorganic material on at least one surface or part of the surface of the polymer film,
the porous coating being produced by means of laser ablation, wherein the laser ablation is arranged by focusing laser pulses of a short duration to a target comprising inorganic material, thus detaching inorganic material from the target, and directing detached inorganic material to the at least one surface or part of the surface of the polymer film, whereby the inorganic material attaches to the at least one surface or part of the said surface of the polymer film, wherein
the porous coating leaves micropores of the polymer film open,
the porosity of the porous coating is principally thorough, and
the porosity of the porous coating allows diffusion of ions through the porous coating and the polymer film.

\* \* \* \* \*